(12) United States Patent
Carr et al.

(10) Patent No.: US 7,741,867 B2
(45) Date of Patent: Jun. 22, 2010

(54) DIFFERENTIAL ON-LINE TERMINATION

(75) Inventors: Dennis Carr, Roseville, CA (US); Lidia Warnes, Roseville, CA (US); Dan Vu, Elk Grove, CA (US); Teddy Lee, Roseville, CA (US); Michael Bozich Calhoun, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/262,051

(22) Filed: Oct. 30, 2008

(65) Prior Publication Data

US 2010/0109704 A1 May 6, 2010

(51) Int. Cl.
*H03K 19/003* (2006.01)
(52) U.S. Cl. .......................................... 326/30; 326/27
(58) Field of Classification Search .................. 326/30, 326/26–27, 31
See application file for complete search history.

(56) References Cited

U.S. PATENT DOCUMENTS

| 6,625,065 | B2 | 9/2003 | Gall |
| 7,092,312 | B2 | 8/2006 | Choi |
| 7,205,788 | B1 * | 4/2007 | Wang et al. ................... 326/30 |
| 7,397,712 | B2 | 7/2008 | Choi |
| 2001/0035768 | A1 * | 11/2001 | Garlepp et al. ................ 326/30 |
| 2003/0208668 | A1 | 11/2003 | To et al. |
| 2005/0023650 | A1 | 2/2005 | Forbes |
| 2005/0134303 | A1 | 6/2005 | Best et al. |
| 2006/0071683 | A1 | 4/2006 | Best et al. |
| 2006/0261438 | A1 | 11/2006 | Forbes |
| 2007/0139071 | A1 * | 6/2007 | Nguyen ........................ 326/30 |
| 2008/0129349 | A1 * | 6/2008 | Yanbo et al. ................. 327/112 |

* cited by examiner

Primary Examiner—James Cho

(57) ABSTRACT

Memory devices and systems incorporate on-die termination for signal lines. A memory device comprises an integrated circuit die. The integrated circuit die comprises a pair of input signal pins that supply a pair of input signals, and an on-die termination circuit coupled between the pair of input signal pins that differentially terminates the pair of input signals.

15 Claims, 5 Drawing Sheets

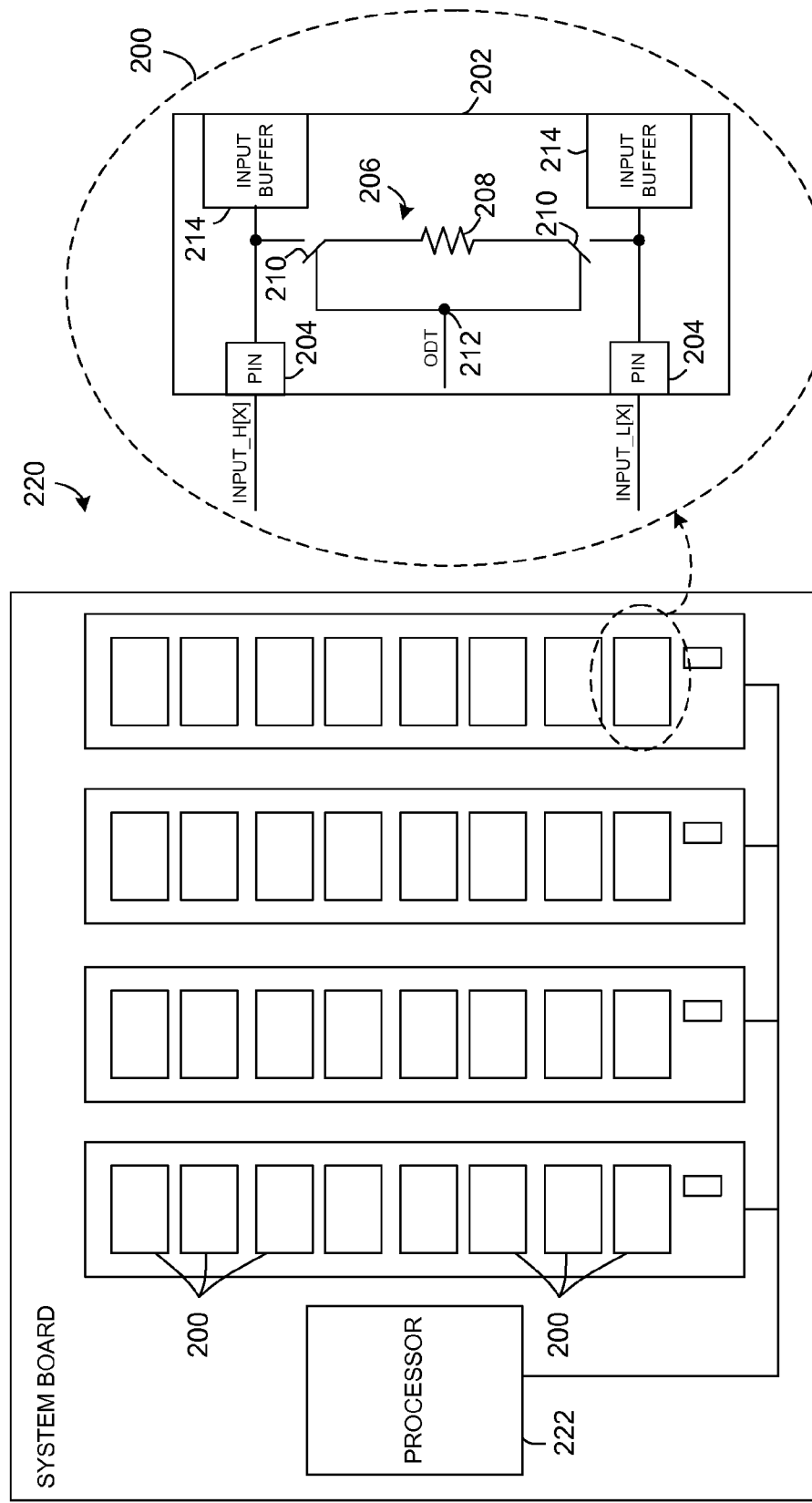

DIFFERENTIAL ON-LINE TERMINATION

BACKGROUND

As memory in computers, servers, and other computational, communication, storage, and electronic devices has evolved toward increased speed and performance, memory power consumption has also increased. Although new generations of memory technology implement lower voltages with the goal of decreasing power, device developments and techniques are sought to reduce power draw in future systems.

The simplest traditional approach for reducing power draw from dynamic random access memory (DRAM) generation to DRAM generation has been to lower voltage. For example, memory class double data rate 1 (DDR1) uses 2.5V for the $V_{DD}$ positive power voltage supply rail, class DDR 2 uses 1.8V, and class DDR3 uses 1.5V. Even within the same technology, sometimes a lower voltage grade is introduced. For example, the DDR2 standard was originally 1.8V at introduction. Joint Electron Device Engineering Council (JEDEC) is currently developing a DDR2 1.5V specification. Although supply voltage reduction can be an effective way to reduce power consumption, sometimes suppliers have to compensate with higher current requirements. Lowering the voltage within a technology can require controller changes that are not simply backwards compatible, thus requiring a new subsystem design to exploit lower voltage parts.

Traditional DRAMs and memory controllers use internal pull-up and pull-down resistors to terminate all data and strobe lines. Typical values are 100 ohm up and 100 ohm down although other values are available. The termination rails are $V_{DD}$ and GND. FIG. 4 shows an example of on-die single-ended termination (ODT) circuitry.

SUMMARY

Embodiments of memory devices and systems incorporate on-die termination for signal lines. A memory device comprises an integrated circuit die. The integrated circuit die comprises a pair of input signal pins that supply a pair of input signals, and an on-die termination circuit coupled between the pair of input signal pins that differentially terminates the pair of input signals.

BRIEF DESCRIPTION OF THE DRAWINGS

Embodiments of the invention relating to both structure and method of operation may best be understood by referring to the following description and accompanying drawings:

FIGS. 2A and 2B are schematic block and circuit diagrams showing an embodiment of a system that uses on-die termination for memory signal lines;

DETAILED DESCRIPTION

Embodiments of systems, memory devices, and associated fabrication methods enable usage of differential on-die termination for signal lines, such as strobe lines in memory devices and controllers including memory controller implementations, dynamic random access memories (DRAMs), dual in-line memory modules (DIMMs), and the like.

Memory devices such as DRAMs, memory controllers, and the like can be configured for differential termination. Memory devices with differential on-die termination improve over traditional memory device which use single-ended termination by enabling memory subsystems to save power and advantages attained with true differential signals.

Systems and memory devices are disclosed herein which supply immunity to voltage changes on the VDD rail between the controller and the DRAMs. The strobes are truly differential rather than referenced to the $V_{REF}$ rail.

Figure 1A:
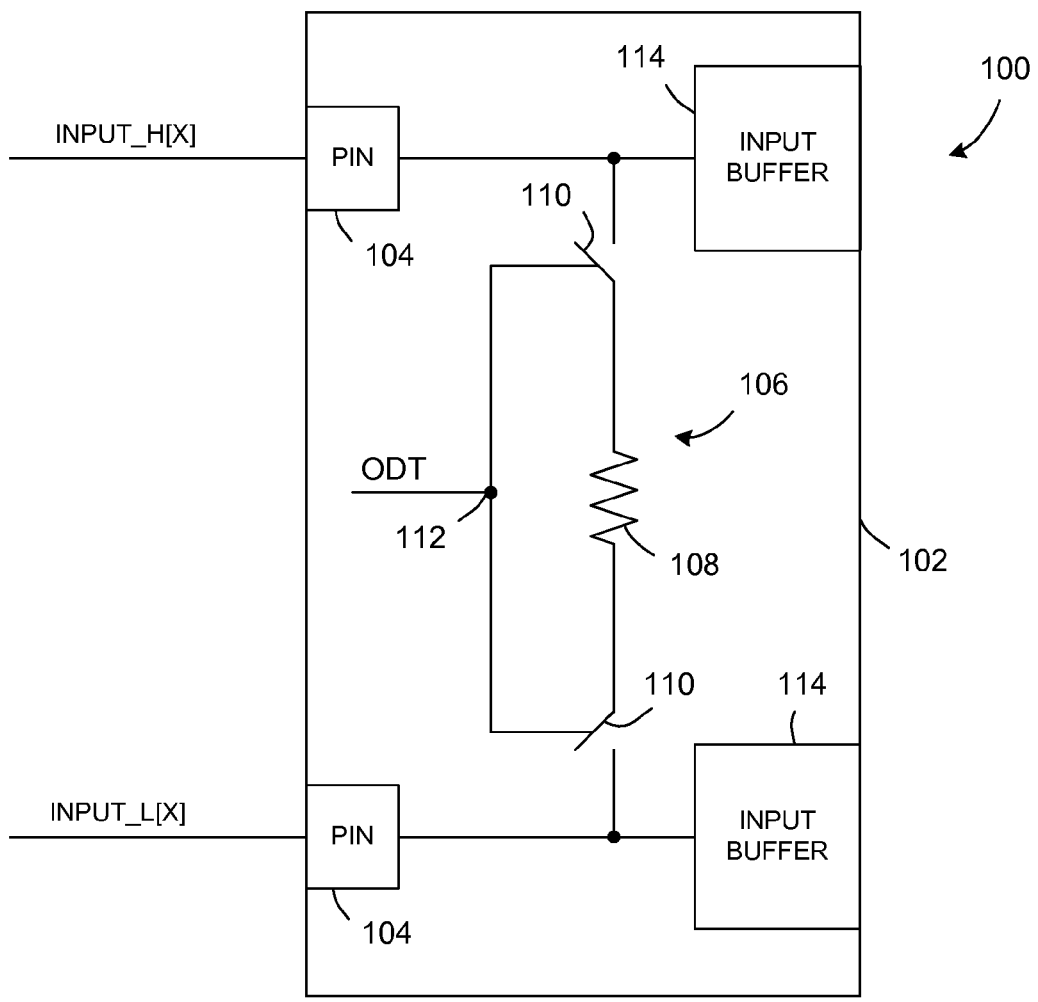
FIGS. 1A and 1B are schematic block and circuit diagrams depicting embodiments of memory devices that incorporate on-die termination for signal lines.

Referring to FIG. 1A, a schematic block and circuit diagram depicts an embodiment of a memory device 100 that incorporates on-die termination for signal lines. The memory device 100 comprises an integrated circuit die 102. The integrated circuit die 102 comprises a pair of input signal pins 104 that supply a pair of input signals, and an on-die termination circuit 106 coupled between the pair of input signal pins 104 that differentially terminates the pair of input signals.

In the illustrative implementation, the on-die termination circuit 106 can comprise an on-die termination resistor 108 and first and second switches 110 that respectively and switchably couple the termination resistor 108 to the pair of input signal pins 104. A control signal node 112 is coupled to the first and second switches 110 for controlling on-die termination.

The integrated circuit die 102 can further comprise a pair of input buffers 114 respectively coupled to the pair of input signal pins 104. The on-die termination circuit 106 can be coupled to nodes between the input buffers 114 and input signal pins 104.

In various embodiments, the input signal pins 104 can be implemented as data (DQ), data strobe (DQS), read strobe (RDQS), data mask (DM) pins, or any other signal pins.

The memory device 100 can be any suitable memory apparatus such as a dynamic random access memory (DRAM), a memory controller, a memory module, or the like.

Figure 4:
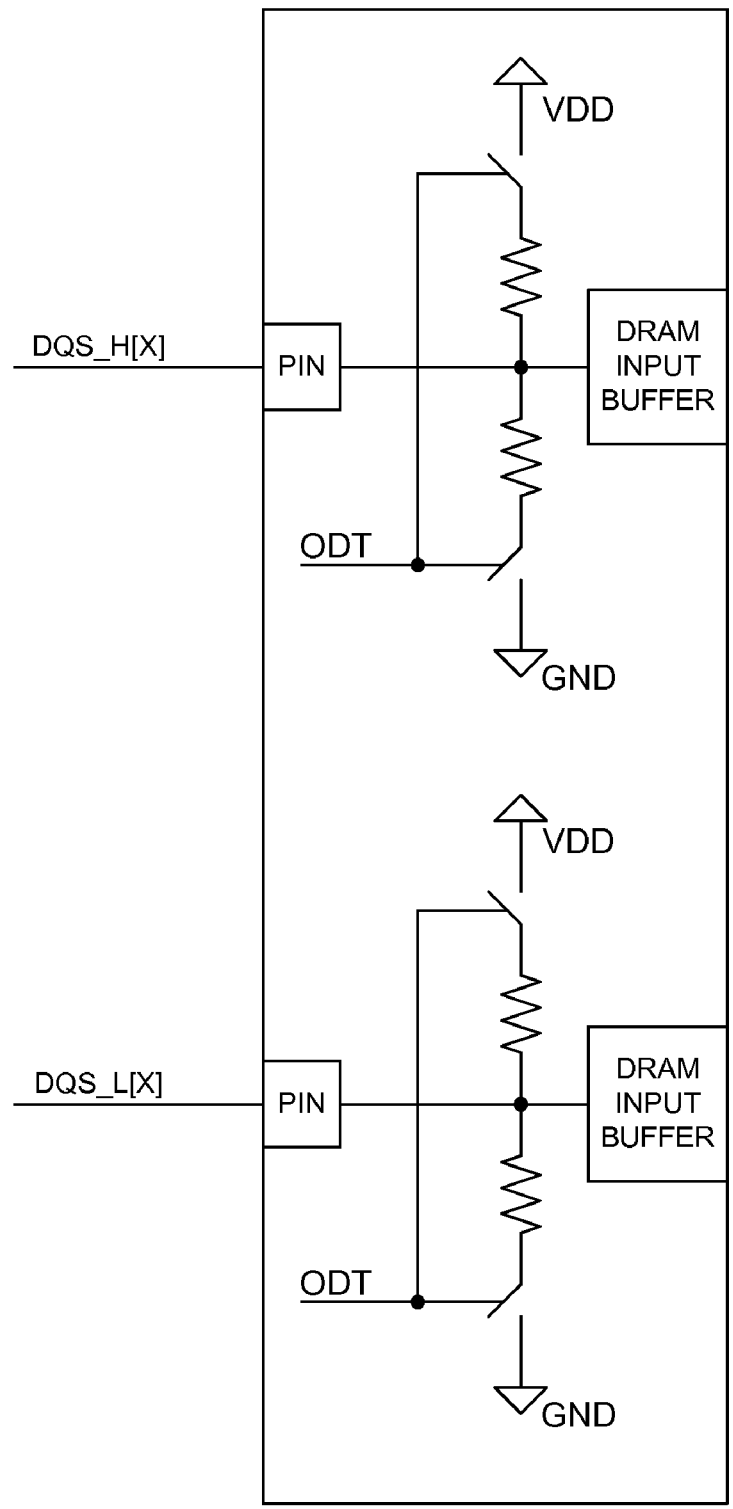
FIG. 4 depicts an example of on-die single-ended termination (ODT) circuitry.

Functionality of the differential on-die termination circuit can be contrasted to that of the single-ended on-die termination (ODT) circuitry shown in FIG. 4. When termination is activated in the single-ended configuration, each signal line will then draw a minimum of $(V^2)/(R_{up}+R_{down})$ power from the VDD rail if the line is tri-stated, and a maximum of $(V^2)/(R_{up\_or\_down})$ if the rail is high or low. Assuming 100 ohm termination values, for DDR2 this is $(1.8^2)/(200)=16.2$ mW per signal line while tri-stated up to 32.4 mW maximum when the signal is driven high or low.

For the differential on-die termination circuit depicted in FIG. 1A, if the lines (for example DQS signal lines) are tri-stated, no current is drawn from the $V_{DD}$ rail. When the signal lines are driven, the power draw is $(V^2)/(R_{diff})$ or $(1.8^2)/100=32.4$ mW. Although the result appears to be the same as the single-ended termination case, the difference is that the 32.4 mW is for two signals rather than one so that per-signal power draw is only 16.2 mW for the differential termination case. Overall the power savings per signal is 16.2 mW per DQS signal line. In a system or memory device with 36 DQS signal lines, in a specific example 18 differential pairs on a DIMM using four-wide DRAMs, the total power savings on a DDR2 DIMM is 583 mW.

The illustrative differential termination thus can save approximately 50% of power when terminating a driven line in comparison to single-ended termination. In practice a large part of savings is expected to result because no termination power is drawn when the line is tri-stated in comparison to the significant power draw for single-ended termination when tri-stated. Whenever the bus is idle, the differential lines are tri-stated and any single-ended termination would use power. The power savings for the system with differential termination can be substantial since bus idle time is common, for example a typical system can have 60% idle time although smaller and larger idle time percentages are expected. Accordingly, differential termination is expected to achieve a minimum power savings of 50%. Any idle time for which the lines are tri-stated saves even more power. Power is thus saved for different operating aspects, specifically the power savings for terminating a driven line and the power savings for bus idle time.

Total system savings is slightly more complex and depends on system configuration and access schemes. In some systems, not all DIMMs are terminated during all transactions.

In one example server, when fully loaded three DIMMs are installed on each channel, but only two of the three DIMMs are terminated. Another example server can have up to four DIMMs on a channel in which case three of four DIMMs are terminated.

In one example server, both ranks of a two-rank DIMM are terminated which doubles the per-terminated DIMM power saving. Thus, the total power savings for a fully loaded system with 48 two-rank DIMMs is 48×(⅔)×2×583 mW=37.3 W. Compared with the total system's power capability of 380 W, the reduction in power requirements is approximately 10%.

In another example, only the first rank of a DIMM is ever terminated and the total power savings is 64×(¾)×583 mW=28.0 W. Compared with the total system power capability of 640 W, the result is a 4.4% reduction in power requirements.

The examples are expressed to estimate the possible power savings of differential on-die termination and may result in smaller or larger improvements based on various design factors.

Differential on-die termination may result in even greater reduction in power requirements for future DRAM technologies which user different drivers for the strobes and the data lines. Current technology uses the same drivers for both strobes and data lines.

Figure 1B:
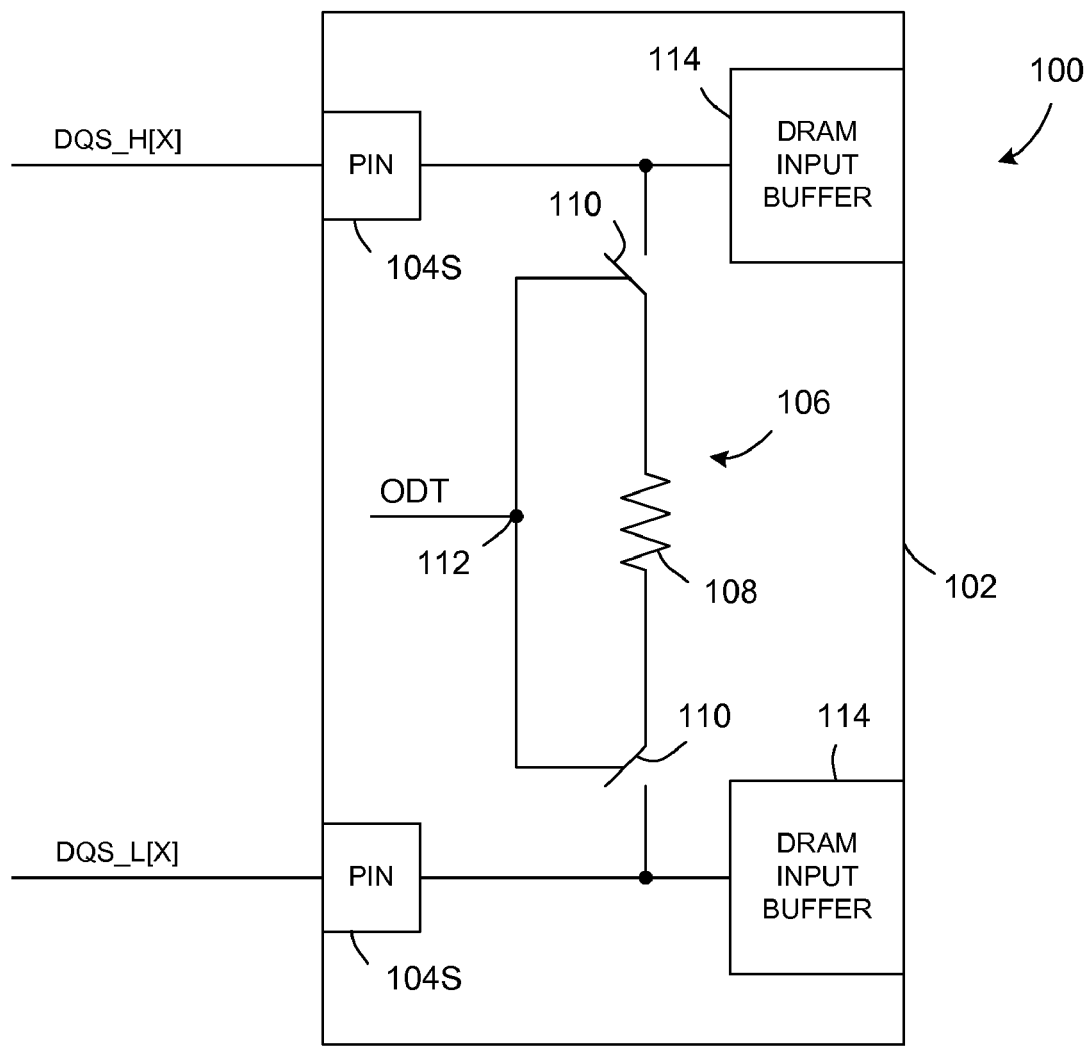

Referring to FIG. 1B, a schematic block and circuit diagram depicts an embodiment of a memory device 100 that incorporates on-die termination for strobe lines of the device. The on-die termination circuit 106 can supply differential on-die termination for strobe lines in the memory device 100 wherein the integrated circuit die 102 comprises a pair of input strobe pins 104S that supply a pair of input strobe signals. The on-die termination circuit 106 coupled between the pair of input strobe pins 104S that differentially terminates the pair of strobe signals.

The input strobe pins 104S can be implemented as data strobe (DQS), read strobe (RDQS), or any strobe pins.

Referring to FIGS. 2A and 2B, schematic block and circuit diagrams show an embodiment of a system 220 that uses on-die termination for memory signal lines. The system 220 comprises a processor 222 and at least one memory device 200. The memory device 200, shown in insert in FIG. 2B, comprises one or more integrated circuit dies 202. An integrated circuit die 202 comprises a plurality of input signal pins 204 that supply a plurality of input signals, and one or more on-die termination circuits 206 coupled between pairs of input signal pins 204 that differentially terminate the pairs of input signals.

The on-die termination circuits 206 can be configured as on-die termination resistor 208 and switches 210 that selectively couple the termination resistors 208 to pairs of input signal pins 204. A control signal node 212 is coupled to the switches 210 for controlling on-die termination. The integrated circuit die 202 can also include input buffers 214 coupled to the input signal pins 204. The on-die termination circuit 206 can be coupled to nodes between the input buffers 214 and input signal pins 204.

For a configuration in which differential termination is applied to data and other signals, in addition to strobe signals, the input signal pins 204 can be implemented as data (DQ), data strobe (DQS), read strobe (RDQS), data mask (DM) pins, or any other suitable signal pins.

Examples of suitable memory device 200 can include dynamic random access memory (DRAM), a memory controller, dual in-line memory modules (DIMM), single in-line memory modules (SIMM), or others.

In some configurations, differential on-line termination can be applied to strobe lines in memory devices and controllers. For example, the on-die termination circuit 206 can supply differential on-die termination for strobe lines in the memory device 200 and can be configured as a pair of input strobe pins 204 that supply a pair of input strobe signals. The on-die termination circuit 206 coupled between the pair of input strobe pins 204 differentially terminates the pair of strobe signals. Suitable input strobe pins 204 can be data strobe (DQS), read strobe (RDQS), or any strobe pins.

Figure 3:
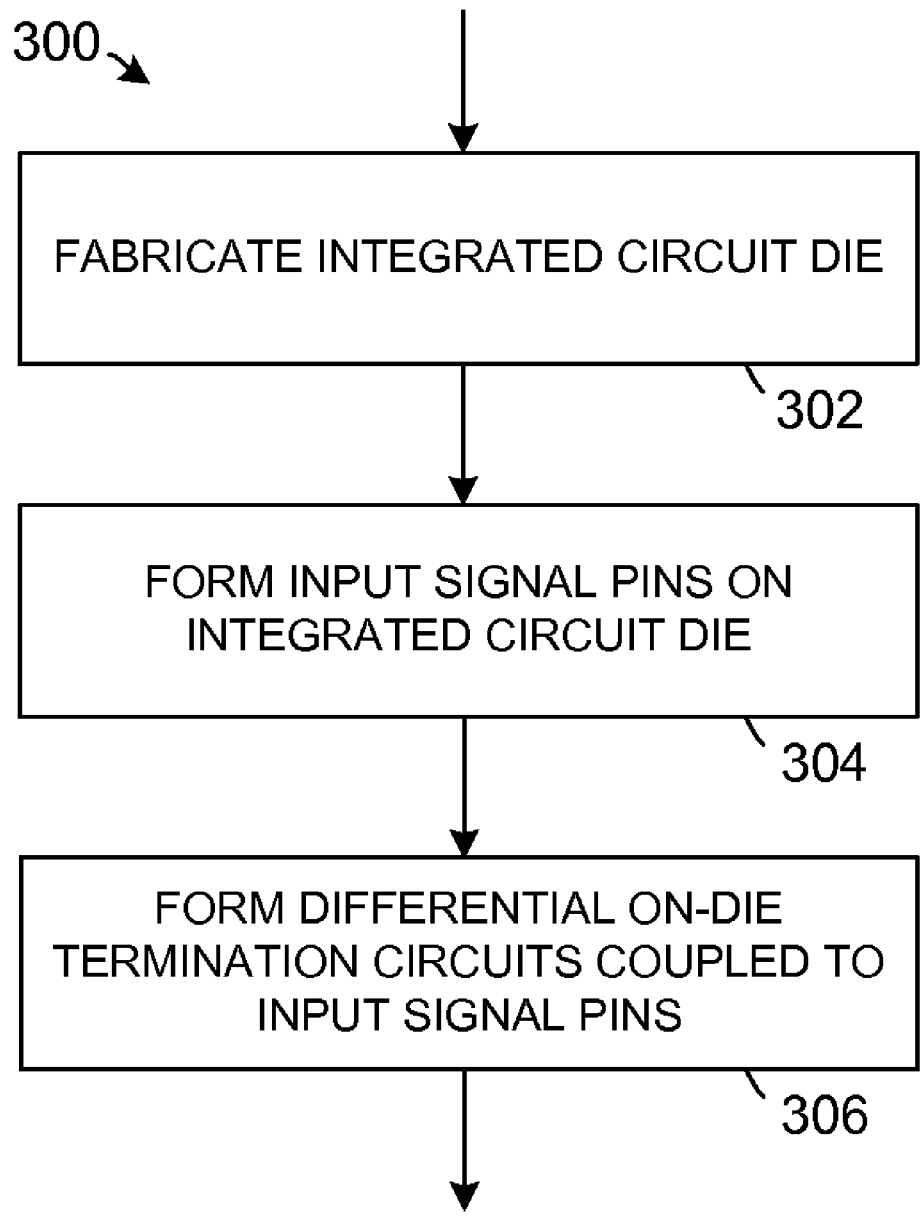
FIG. 3 is a flow chart illustrating an embodiment and aspects of a method for manufacturing a memory apparatus that uses differential on-die termination for signal lines.

Referring to FIG. 3, a flow chart illustrates an embodiment and aspects of a method for manufacturing a memory apparatus that uses differential on-die termination for signal lines. The method for manufacturing 300 the memory apparatus comprises fabricating 302 an integrated circuit die, and forming 304 at least one pair of input signal pins on the integrated circuit die that supply a pair of input signals. One or more on-die termination circuits are formed 306 that are coupled between pairs of input signal pins. The on-die termination circuit or circuits differentially terminate the pair of input signals.

Differential on-die termination of memory devices and systems facilitates reduction of power requirements regardless of the $V_{DD}$ voltage level and regardless of termination settings, for example whether termination is persistent or dynamic. (Taking into consideration that more power is saved when the data bus utilization is higher regardless of the termination mode.) With truly differential termination, if the signaling level at the DRAM changes the memory device remains backward compatible with the controller. The illustrative differential on-die termination arrangements reduce from four to one the number of on-die termination resistors used to terminate the differential strobe lines.

Terms "substantially", "essentially", or "approximately", that may be used herein, relate to an industry-accepted tolerance to the corresponding term. Such an industry-accepted tolerance ranges from less than one percent to twenty percent and corresponds to, but is not limited to, functionality, values, process variations, sizes, operating speeds, and the like. The term "coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. Inferred coupling, for example where one element is coupled to another element by inference, includes direct and indirect coupling between two elements in the same manner as "coupled".

The illustrative block diagrams and flow charts depict process steps or blocks in a manufacturing process. Although the particular examples illustrate specific process steps or acts, many alternative implementations are possible and commonly made by simple design choice. Acts and steps may be executed in different order from the specific description herein, based on considerations of function, purpose, conformance to standard, legacy structure, and the like.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims.

What is claimed is:

1. A memory apparatus comprising:
a memory device configured with on-die differential termination of memory device data and strobe lines wherein memory device power draw is reduced comprising:
   an integrated circuit die comprising:
      a pair of input signal pins that supply a pair of input signals; and
      an on-die termination circuit coupled between the pair of input signal pins that differentially terminates the pair of input signals.

2. The apparatus according to claim 1 further comprising:
the on-die termination circuit comprising differential on-die termination for strobe lines in the memory device.

3. The apparatus according to claim 1 further comprising:
the integrated circuit die comprising:
   the pair of input strobe pins that supply a pair of input strobe signals; and
   the on-die termination circuit coupled between the pair of input strobe pins that differentially terminates the pair of strobe signals.

4. The apparatus according to claim 1 further comprising:
the on-die termination circuit comprising:
   an on-die termination resistor;
   first and second switches respectively and switchably coupling the termination resistor to the pair of input signal pins; and
   a control signal node coupled to the first and second switches for controlling on-die termination.

5. The apparatus according to claim 1 further comprising:
the integrated circuit die comprising:
   a pair of input buffers respectively coupled to the pair of input signal pins; and
   the on-die termination circuit coupled to nodes between the input buffers and input signal pins.

6. The apparatus according to claim 1 further comprising:
the input signal pins selected from a group consisting of data (DQ), data strobe (DQS), read strobe (RDQS), and data mask (DM).

7. The apparatus according to claim 1 wherein:
the memory device is a device selected from a group consisting of a dynamic random access memory (DRAM), and a memory controller.

8. A system comprising:
a processor; and
at least one memory device configured with on-die differential termination of memory device data and strobe lines wherein memory device power draw is reduced comprising:
   at least one integrated circuit die comprising:
      a plurality of input signal pins that supply a plurality of input signals; and
      at least one on-die termination circuit coupled between pairs of input signal pins that differentially terminates the pair of input signals.

9. The system according to claim 8 further comprising:
the at least one on-die termination circuit comprising differential on-die termination for strobe lines in the at least one memory device.

10. The system according to claim 8 further comprising:
the at least one integrated circuit die comprising:
   the pair of input strobe pins that supply a pair of input strobe signals; and
   the on-die termination circuit coupled between the pair of input strobe pins that differentially terminates the pair of strobe signals.

11. The system according to claim 8 further comprising:
the at least one on-die termination circuit comprising:
   at least one on-die termination resistor;
   first and second switches respectively and switchably coupling the at least one termination resistor to the pair of input signal pins; and
   a control signal node coupled to the first and second switches for controlling on-die termination.

12. The system according to claim 8 further comprising:
the at least one integrated circuit die comprising:
   input buffers respectively coupled to corresponding input signal pins; and
   the at least one on-die termination circuit coupled to nodes between the input buffers and input signal pins.

13. The system according to claim 8 further comprising:
the input signal pins selected from a group consisting of data (DQ), data strobe (DQS), read strobe (RDQS), and data mask (DM).

14. The system according to claim 8 wherein:
the at least one memory device are selected from a group consisting of dynamic random access memories (DRAMs), a dual in-line memory module comprising a plurality of dynamic random access memories (DRAMs), and a memory controller.

15. A method for manufacturing a memory apparatus comprising:
manufacturing a memory device configured with on-die differential termination of memory device data and strobe lines wherein memory device power draw is reduced comprising:
   fabricating an integrated circuit die;
   forming at least one pair of input signal pins on the integrated circuit die that supply a pair of input signals; and
   forming at least one on-die termination circuit coupled between pairs of input signal pins, the at least one on-die termination circuit that differentially terminates the pair of input signals.

* * * * *